(12) United States Patent
Senderos et al.

(10) Patent No.: US 11,070,123 B2
(45) Date of Patent: Jul. 20, 2021

(54) ENERGY STORAGE AND ENERGY STORAGE DEVICE

(71) Applicant: THE BOEING COMPANY, Chicago, IL (US)

(72) Inventors: Bruno Zamorano Senderos, Huntsville, AL (US); John R. Hull, Sammamish, WA (US); Daniel Elliott Sievers, Owens Cross Roads, AL (US)

(73) Assignee: THE BOEING COMPAN, Chicago, IL (US)

( * ) Notice: Subject to any disclaimer, the term of this patent is extended or adjusted under 35 U.S.C. 154(b) by 791 days.

(21) Appl. No.: 15/711,654

(22) Filed: Sep. 21, 2017

(65) Prior Publication Data
US 2019/0013724 A1    Jan. 10, 2019

Related U.S. Application Data

(60) Provisional application No. 62/529,844, filed on Jul. 7, 2017.

(51) Int. Cl.
| | | |
|---|---|---|
| *H01F 7/00* | (2006.01) | |
| *H02K 55/00* | (2006.01) | |
| *H01F 6/04* | (2006.01) | |
| *H01F 6/06* | (2006.01) | |
| *H01L 39/24* | (2006.01) | |

(52) U.S. Cl.
CPC ............... *H02K 55/00* (2013.01); *H01F 6/04* (2013.01); *H01F 6/06* (2013.01); *H01L 39/2419* (2013.01)

(58) Field of Classification Search
CPC .. H01F 6/06; H01F 6/04; H02K 55/00; H01L 39/2419

USPC .......................................................... 335/216
See application file for complete search history.

(56) References Cited

U.S. PATENT DOCUMENTS

| | | | |
|---|---|---|---|
| 3,253,193 A | | 5/1966 | Lubell et al. |
| 3,518,496 A | | 6/1970 | Schweitzer |
| 4,078,747 A | | 3/1978 | Minovitch |
| 4,151,498 A | * | 4/1979 | Katsurai ................... H01F 6/06 335/216 |
| 4,363,773 A | * | 12/1982 | Mine ........................ H01F 6/04 335/216 |

(Continued)

FOREIGN PATENT DOCUMENTS

| | | |
|---|---|---|
| CN | 2593445 | 12/2003 |
| CN | 2593445 Y | 12/2003 |

(Continued)

OTHER PUBLICATIONS

Durrell, J. H., et al., "A trapped field of 17.6T in melt-processed, bulk Gd—Ba—Cu—O reinforced with shrink-fit steel," 2014, Superconductor Science and Technology, vol. 27, 6 pgs.

(Continued)

*Primary Examiner* — Shawki S Ismail
*Assistant Examiner* — Lisa N Homza
(74) *Attorney, Agent, or Firm* — Moore IP Law

(57) ABSTRACT

An energy storage device includes multiple bulk superconductor rings and at least one superconductor wire coil between the multiple bulk superconductor rings. The multiple bulk superconductor rings and the at least one superconductor wire coil are interconnected to define a closed geometric shape.

20 Claims, 9 Drawing Sheets

(56) References Cited

U.S. PATENT DOCUMENTS

| | | | | |
|---|---|---|---|---|
| 4,378,545 | A | * | 3/1983 | Bonanos .................. G21B 1/11 335/216 |
| 4,528,609 | A | * | 7/1985 | Purcell .................. H02H 7/001 174/15.5 |
| 4,896,130 | A | * | 1/1990 | Ermilov .................... H01F 7/20 335/300 |
| 4,920,095 | A | * | 4/1990 | Ishigaki .................... H01F 6/00 322/2 R |
| 5,130,687 | A | * | 7/1992 | Evrard ...................... H01F 6/00 335/216 |
| 5,289,150 | A | | 2/1994 | Rabinowitz |
| 5,374,914 | A | * | 12/1994 | Prueitt ...................... H01F 6/00 335/216 |
| 5,384,197 | A | * | 1/1995 | Koyama .................. H01F 6/06 174/125.1 |
| 5,545,932 | A | | 8/1996 | Estop et al. |
| 5,909,167 | A | * | 6/1999 | Muller .................... H01F 36/00 336/223 |
| 6,083,886 | A | | 7/2000 | Hayashi et al. |
| 6,335,622 | B1 | * | 1/2002 | James ............. G01R 33/34023 324/318 |
| 7,116,206 | B2 | * | 10/2006 | Ames .................. H01F 27/2895 336/229 |
| 7,889,035 | B2 | | 2/2011 | Hull et al. |
| 8,003,072 | B2 | | 8/2011 | Cardwell et al. |
| 8,008,826 | B2 | | 8/2011 | Hull et al. |
| 8,806,950 | B2 | | 8/2014 | Hull et al. |
| 10,573,458 | B2 | * | 2/2020 | Hull ......................... H01F 6/04 |
| 2006/0124050 | A1 | | 6/2006 | Tarrant et al. |
| 2006/0291112 | A1 | | 12/2006 | Markiewicz |
| 2009/0033145 | A1 | * | 2/2009 | McIver .................... B60T 1/10 303/48 |
| 2010/0038986 | A1 | * | 2/2010 | Hull ...................... H02K 55/02 310/165 |
| 2010/0323900 | A1 | * | 12/2010 | Kawashima ............ H01F 6/065 505/211 |
| 2011/0031431 | A1 | * | 2/2011 | Hull ........................ B29B 11/10 252/62.54 |
| 2012/0122697 | A1 | * | 5/2012 | Miyazaki .................. H01F 6/06 505/211 |
| 2013/0255437 | A1 | * | 10/2013 | Hull ...................... F16F 15/315 74/572.11 |
| 2013/0260999 | A1 | * | 10/2013 | Hull ...................... F16F 15/305 505/163 |
| 2015/0255200 | A1 | | 9/2015 | Solovyov et al. |
| 2016/0042841 | A1 | * | 2/2016 | Rodriguez Zermeno ................... H01B 12/02 505/211 |
| 2016/0122025 | A1 | * | 5/2016 | Hull ....................... H05B 6/105 219/634 |
| 2016/0380526 | A1 | | 12/2016 | Hull et al. |
| 2017/0016967 | A1 | * | 1/2017 | Hull ....................... H05B 6/105 |
| 2018/0330856 | A1 | * | 11/2018 | Mine ...................... G01R 33/36 |
| 2019/0006072 | A1 | * | 1/2019 | Hull ....................... B64D 41/00 |
| 2019/0013724 | A1 | * | 1/2019 | Senderos .................. H01F 6/06 |
| 2019/0115131 | A1 | * | 4/2019 | Clemen, Jr. .............. H01F 6/06 |
| 2019/0115133 | A1 | * | 4/2019 | Clemen, Jr. .............. H01F 41/08 |
| 2020/0143968 | A1 | * | 5/2020 | Stephenson ............. H01F 6/003 |
| 2020/0211744 | A1 | * | 7/2020 | Labombard ............... H01F 6/06 |

FOREIGN PATENT DOCUMENTS

| | | | |
|---|---|---|---|
| CN | 103138532 | A | 6/2013 |
| EP | 2581956 | A2 | 4/2013 |
| EP | 2581956 | B1 | 4/2016 |
| JP | S6426327 | A | 1/1989 |
| JP | S6426327 | U | 2/1989 |
| JP | 07211546 | | 8/1995 |
| JP | 4067749 | B2 | 3/2008 |

OTHER PUBLICATIONS

Hull, John R., et al., "Applications of Bulk High-Temperature Superconductors," Oct. 2004, Proceedings of the IEEE, vol. 92, No. 10, pp. 1705-1718.

"System and Method for Operating a Bulk Superconductor Device," U.S. Appl. No. 15/639,814, filed Jun. 30, 2017, pp. 1-37.

Haugan, Timothy J., "Design of SMES Devices for Air and Space Applications," Air Force Research Laboratory, Oct. 12, 2011, pp. 1-28

GB Examination Report for Application No. GB1810536.1 dated May 27, 2020, 4 pgs.

UK Combined Search and Examination Report for Application No. GB1810536.1, dated Jan. 15, 2019, 11 pgs.

UK Search and Examination Report for Application No. GB1810536.1 dated Jun. 27, 2019, 10 pgs.

Yoon, Yong-Soo, et al., "Design, Fabrication and Testing of a Heater-Trigged High-Tc Superconducting Power Supply", IEEE Transactions on Applied Superconductivity, vol. 10, No. 1, Mar. 2000, pp. 1418-1421.

* cited by examiner

US 11,070,123 B2

ENERGY STORAGE AND ENERGY STORAGE DEVICE

CROSS-REFERENCE TO RELATED APPLICATIONS

The present application claims the benefit of U.S. Provisional Patent Application No. 62/529,844 entitled "MAGNETIC FLUX GUIDES USING REBCO BULK SUPERCONDUCTORS FOR ENERGY STORAGE," filed Jul. 7, 2017, which is expressly incorporated herein by reference in its entirety.

FIELD

The present disclosure generally relates to energy storage and an energy storage device.

BACKGROUND

Energy storage is an important component of most electrical systems. For some applications on mobile or portable platforms, high specific power (e.g., storage energy/mass) of an energy storage device is an important parameter. Total energy storage capacity, charge rate, and discharge rate are also considerations.

For example, for pulsed-power applications, such as directed energy weapons, generating large energy pulses may rely on the energy storage system to discharge large amounts of energy very rapidly. To illustrate, a directed energy weapon may use 5 megajoule (MJ) to 7 MJ pulses with a duration of 5 seconds and may be expected to recharge and shoot again in 2 seconds. Over 6 consecutive shots, such a directed energy weapon has an energy requirement of 25 MJ to 35 MJ.

Technologies that are often considered for energy storage applications include batteries, flywheels, capacitors, and superconducting magnetic energy storage (SMES) using superconductor wires. Capacitors usually have the ability to provide fast discharge; however, capacitors often have significant self-discharge and relatively low specific energy. As another example, batteries and flywheels, by themselves, generally do not have sufficient specific power for pulsed-power applications.

SMES systems are able to discharge quickly, and SMES systems can store energy for indefinitely long periods of time. However, SMES systems typically have a relatively low specific energy due to the large mechanical structure used to contain coils that generate high magnetic fields to store energy. Additionally, shielding may be used to isolate the magnetic fields from the rest of the platform, which adds additional weight.

SUMMARY

In a particular embodiment, an energy storage device includes multiple bulk superconductor rings and at least one superconductor wire coil between the multiple bulk superconductor rings. The multiple bulk superconductor rings and the at least one superconductor wire coil are interconnected to define a closed geometric shape.

In another particular embodiment, a method of operating an energy storage device includes generating a magnetic field in a region of at least one superconductor wire coil responsive to a charging current applied to the at least one superconductor wire coil. The method further includes at least partially confining the magnetic field in a closed shape defined by the at least one superconductor wire coil and multiple bulk superconductor rings.

In another particular embodiment, a system includes a load device and at least one superconductor wire coil coupled to the load device. The system also includes multiple bulk superconductor rings. The at least one superconductor wire coil is between the multiple bulk superconductor rings. The multiple bulk superconductor rings and the at least one superconductor wire coil are arranged to define a magnetic confinement region of an energy storage device.

The described features, functions, and advantages may be achieved independently in various embodiments or may be combined in yet other embodiments further details of which can be seen with reference to the following description and drawings.

DETAILED DESCRIPTION

Figure 1:
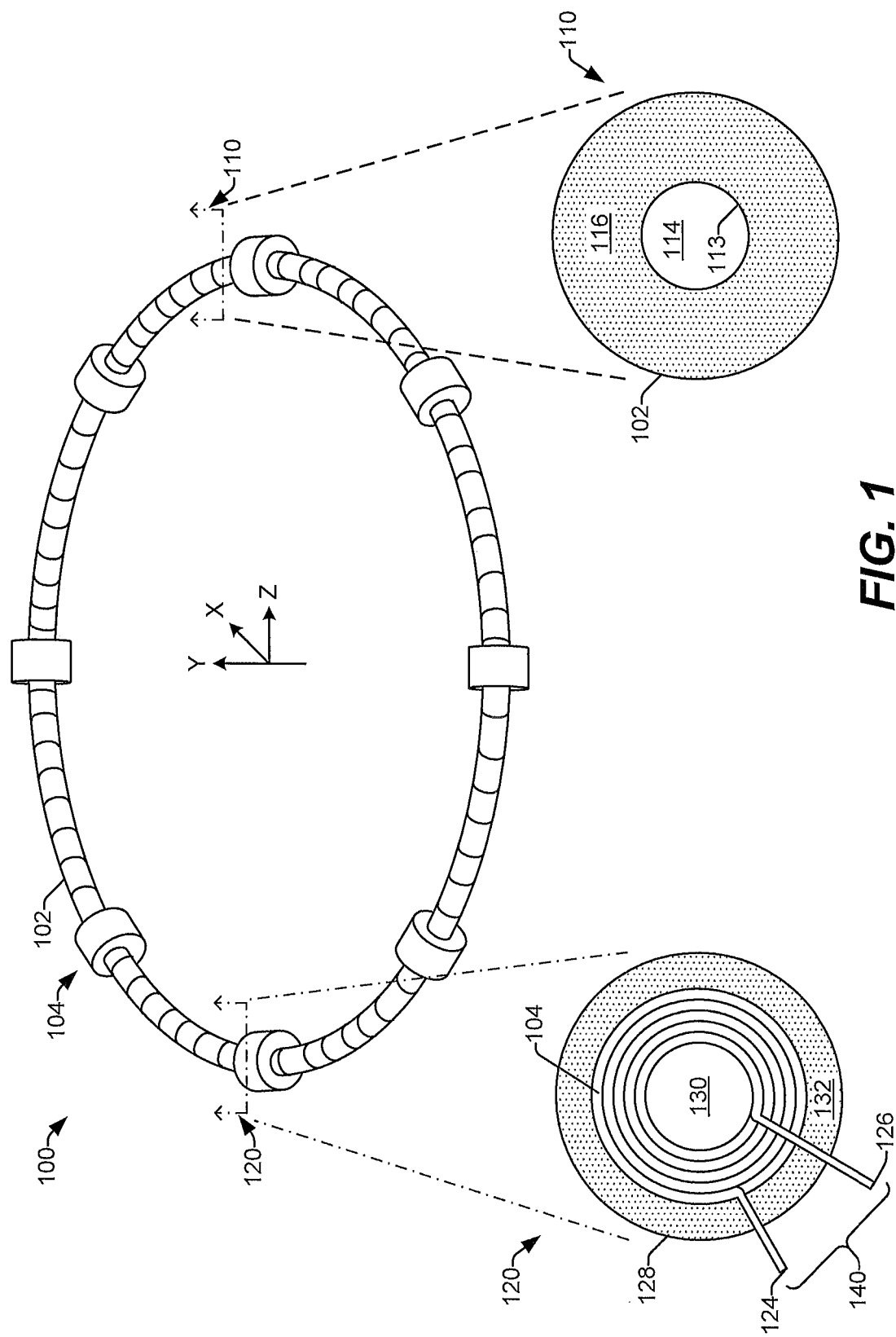
FIG. 1 is a diagram illustrating a particular embodiment of an energy storage device.

As used herein, various terminology is used for the purpose of describing particular implementations only and is not intended to be limiting of implementations. For example, the singular forms "a," "an," and "the" are intended to include the plural forms as well, unless the context clearly indicates otherwise. It may be further understood that the terms "comprise," "comprises," and "comprising" may be used interchangeably with "include," "includes," or "including." Additionally, it will be understood that the term "wherein" may be used interchangeably with "where." As used herein, "exemplary" may indicate an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

As used herein, "bulk superconductor" refers to a generic class of material (e.g., superconducting material) that includes large single-grain blocks, sintered structures, or structures with multiple large grains with the angle of grain boundaries of adjacent grains being small. The bulk superconductor may also take the form of large single-grained superconductors within which circulating currents may flow at large current density without loss. For example, the bulk superconductor is capable of developing magnetizations, similar to that of permanent magnets, but with much larger magnetic fields. Accordingly, the bulk superconductor may be used as a field-trapped component in an energy storage system.

An energy storage device with high specific power and high specific energy is disclosed. The energy storage device uses a magnetic field trapped in magnetic field containment region of a set of bulk superconductor rings. The magnetic field containment region is shaped or arranged to form a closed geometric shape, such that, other than any minor leakage that may occur, the magnetic field is entirely contained within the magnetic field containment region. The energy storage device also includes superconductor wire coils around the magnetic field containment region at one or more locations. For example, the superconductor wire coils may be interspersed between the bulk superconductor rings around the magnetic field containment area. The bulk superconductor rings, the superconductor wire coils, or both, are formed of or include a high temperature superconductor (HTS) material, such as a Rare Earth Barium Copper Oxide material.

The superconductor wire coils are magnetically linked with the bulk superconductor rings, thereby enabling current flowing within the superconductor wire coils to charge (i.e., increase energy stored in) the magnetic field. Additionally, energy from the magnetic field can be discharged (i.e., decrease energy stored in the magnetic field) by inducing a current within the superconductor wire coils. Since the magnetic field is substantially contained within the magnetic field containment region, the energy storage device can be used in many implementations with little or no additional shielding, resulting in a relatively low mass and small footprint energy storage system.

In some implementations, the energy storage device disclosed herein is well suited for use in a pulsed-power application, such as a laser or other directed energy device. For example, the energy storage device (or a system that includes the energy storage device) may be coupled to a load device, such a laser. In this example, the energy storage device may be controlled or otherwise operated to provide pulsed power to the load device. Further, since the energy storage device and supporting equipment can be significantly lighter than other superconducting energy storage systems, the energy storage device is well suited for use in mobile or portable applications. For example, the energy storage device is well suited for use in a vehicle, such as an aircraft, a spacecraft, a land craft, a watercraft, etc.

The energy storage device disclosed herein, which is also referred to as a hybrid SMES system, has high specific energy (e.g., energy per mass unit) and is able to store energy for a prolonged period of time. Because of the ability to store energy in a large magnetic field without the use of external shielding, the energy storage device has a higher specific energy (i.e., energy storage capacity per unit mass) and higher specific power (i.e., charging or discharging rate (measured in energy per time) per unit of mass) than a conventional SMES system that utilizes superconductor material coils to store energy.

FIG. 1 illustrates a particular embodiment of an energy storage device 100 (e.g., a hybrid SMES system). The energy storage device 100 includes multiple bulk superconductor rings 102 and one or more superconductor wire coils 104 interconnected and arranged to define a closed geometric shape. In FIG. 1, the closed geometric shape is a curved shape, such as a circle or an oval within a toroid formed by the bulk superconductor rings 102 and superconductor wire coils 104; however, as described with reference to FIGS. 5A-5D, other closed geometric shapes may be used.

FIG. 1 also illustrates a cross-sectional view 110 of one of the bulk superconductor rings 102 and a cross-sectional view 120 of the one of the superconductor wire coils 104. As shown in the cross-sectional view 110, a bulk superconductor ring 102 includes a superconductive material 116 having an inner wall 113 that defines a central opening 114. The central opening 114 corresponds to or defines a portion of a magnetic field confinement region (such as a magnetic field confinement region 230 of FIGS. 3A-3D). In a particular implementation, the bulk superconductor ring 102 is manufactured by a multi-seeding technique. In order to have a high critical current density, a number of seeds used to manufacture the bulk superconductor ring 102 is sufficiently large to keep the grain boundary angle between adjacent grains small enough that the critical current density is only minimally degraded by the presence of the grain boundaries. For example, in a particular implementation, the bulk superconductor ring 102 with an outer diameter of about 75 millimeters (mm) may be formed using about 8 seeds. In a particular embodiment, the superconductive material 116 is a high-temperature superconductive material, such as a Rare Earth Barium Copper Oxide material with a superconducting transition temperature greater than the boiling point of liquid nitrogen at standard pressure (e.g., 1 atmosphere). Although the bulk superconductor rings 102 are illustrated herein as having a generally circular shape in the cross-sectional view 110 (e.g., in a plane perpendicular to a magnetic field in the magnetic field confinement region), in other implementations, the bulk superconductor rings 102 have a non-circular cross-section in the cross-sectional view 110, such as an elliptical cross-section, a polygonal cross-section, or a geometrically irregular cross-section.

The cross-sectional view 120 illustrates a superconductor wire coil 104 around a central opening 130. The central opening 130 corresponds to or defines a portion of a magnetic field confinement region (such as the magnetic field confinement region 230 of FIGS. 3A-3D). The superconductor wire coil 104 may be formed of a single wire or multiple wires. In the example illustrated in FIG. 1, the superconductor wire coil 104 is formed of a single wire having a first end 124 and a second end 126 that extend from the closed geometric shape. The first end 124 and second end 126 correspond to an electrical interface 140 that can be connected to a load or power source. The number of turns of superconductor wire used in each of the superconductor wire coils 104 is selected to achieve a target voltage. For example, when subjected to a magnetic field in the central opening 130, a coil with more turns will generate a larger voltage than a coil with fewer turns. The number of superconductor wire coils 104 arranged around the closed geometric shape is selected to provide a target power rating of the energy storage device 100. For example, using a larger number of superconductor wire coils 104 will increase the power output capacity of the energy storage device 100 as compared to using a smaller number of superconductor wire coils 104.

Although the central opening 114 and the central opening 130 are illustrated as empty regions in FIG. 1, in other implementations the central openings 114, 130 may include, house, or contain a material that facilitates functioning of the energy storage device 100. For example, the central openings 114, 130 may include a structural member, or structural members, that provide structural support to other components of the energy storage device 100. As another example, a coolant could be flowed through the central openings 114, 130 during to facilitate maintaining superconductive materials within a superconducting temperature range. As another example, a ferromagnetic material could be contained within the central openings to increase energy storage capacity of the energy storage device. Depending on the specific implementations, other materials or components could be housed or contained within the central openings 114, 130 so long as the materials or components were selected or arranged (e.g., protected) in a manner that prevented short circuiting.

In the example illustrated in FIG. 1, each of the superconductor wire coils 104 is partially or completely housed within a ring 128 formed of a superconductive material 132. In some embodiments, the superconductive material 132 includes the same material as the superconductive material 116. In other embodiments, the superconductive material 132 includes a different material than the superconductive material 116. Enclosing the superconductor wire coils 104 within rings 128 of the superconductive material 132 reduces leakage from the energy storage device 100. However, in some implementations, one or more of the superconductor wire coils 104 is not housed within a ring 128 formed of a superconductive material. For example, one or more of the superconductor wire coils 104 may be exposed in contrast to the view illustrated in FIG. 1.

The bulk superconductor rings 102 are configured to act as a magnetic guide to direct a magnetic field in a manner that retains most of the magnetic field in the interior of the closed geometric shape. To illustrate, when a current is applied to the superconductor wire coils 104 to charge (i.e., cause energy to be stored in) the energy storage device 100, the current generates a magnetic field within the central opening 130 of the superconductor wire coils 104. The magnetic field within the central opening 130 of the superconductor wire coils 104 induces current flow within adjacent bulk superconductor rings 102. The current flow in one of the bulk superconductor rings 102, generates a magnetic field within the central opening 114 of the bulk superconductor ring 102. The magnetic field within the central opening 114 of the bulk superconductor ring 102 induces current flow in another of bulk superconductor rings 102. The bulk superconductor rings 102 are electrically isolated from one another (e.g., there is no electrical connection between adjacent bulk superconductor rings 102), thus no net current flows around the closed geometric shape formed by the bulk superconductor rings 102. However, the bulk superconductor rings 102 and the superconductor wire coils 104 are magnetically linked around the closed geometric shape. The magnetic fields of the bulk superconductor rings 102 and the superconductor wire coils 104 are substantially contained within the magnetic field containment region corresponding to the central openings 114, 130 of the bulk superconductor rings 102 and the superconductor wire coils 104 (e.g., the magnetic field containment region causes a magnetic field loop to be formed). Leakage or losses from between adjacent bulk superconductor rings 102 can be reduced by reducing distance between the adjacent bulk superconductor rings 102. Similarly, leakage or losses from between a particular one of the superconductor wire coils 104 and an adjacent one of the bulk superconductor rings 102 can be reduced by reducing the distance between the superconductor wire coil and the adjacent bulk superconductor ring.

The energy storage device 100 can be charged by applying a current to one or more of the superconductor wire coils 104. Further, the energy storage device 100 can be discharged by coupling one or more of the superconductor wire coils 104 to a load device. Thus, a simple switching system can be used to charge or discharge the energy storage device 100, rather than more complex configurations used to charge and discharge other superconducting magnetic energy storage systems.

In operation, to store energy in the energy storage device 100, a current is applied to one or more of the superconductor wire coils 104. Current flowing through the one or more superconductor wire coils 104 induces a magnetic field in the magnetic field containment region. As explained above, the magnetic field is confined within the magnetic field containment region of the closed geometric shape formed by the energy storage device 100. While the superconductive material 116 and a superconductive material of the superconductor wire coils 104 are cooled to operate within a superconducting region, the magnetic field can be stored within the closed geometric shape indefinitely.

Figure 4:
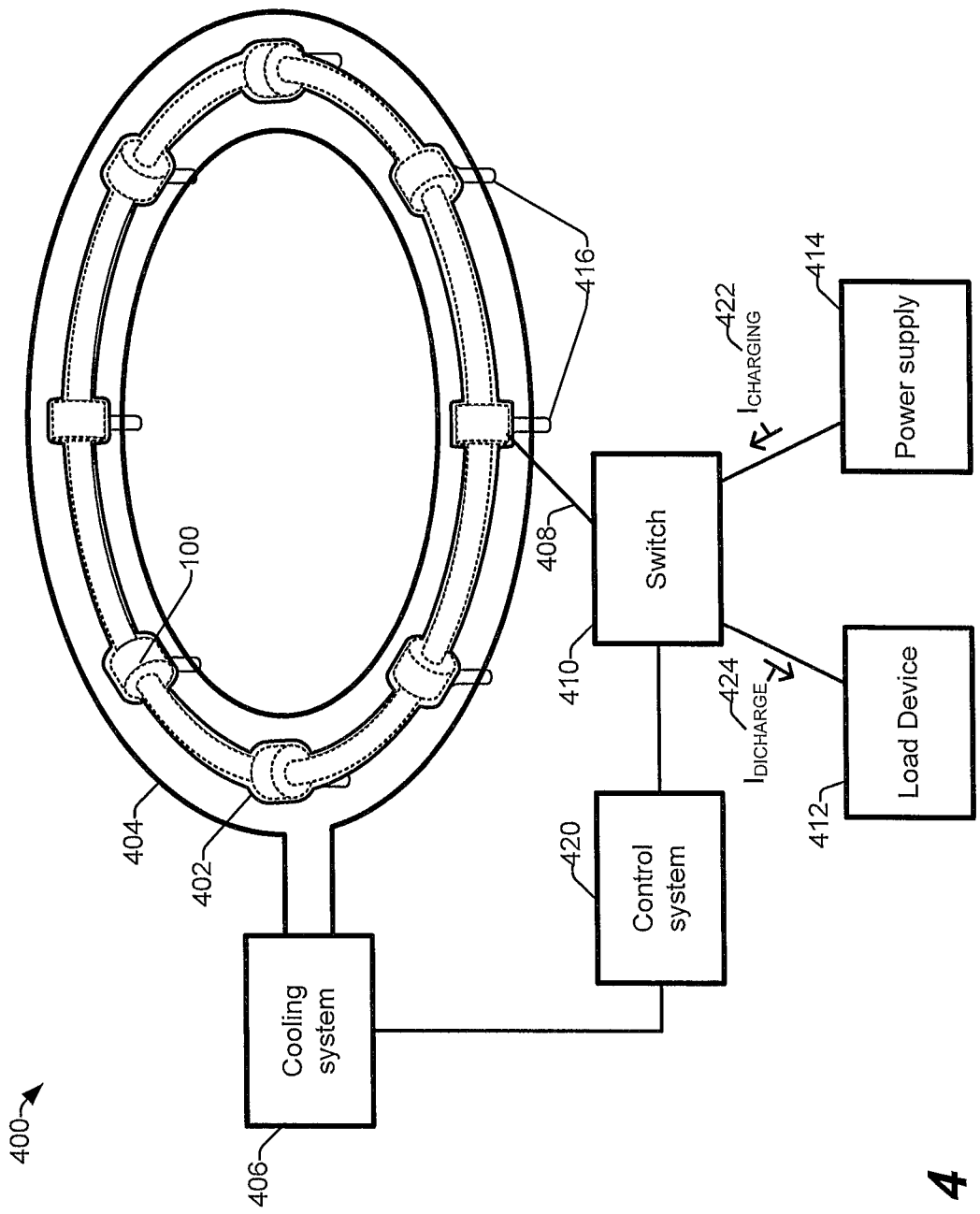
FIG. 4 is a diagram illustrating a particular embodiment of a system that includes the energy storage device of FIG. 1.

To discharge energy from the energy storage device 100, one or more of the superconductor wire coils 104 are coupled to a load device. The magnetic field within the magnetic field containment region induces a current within the one or more superconductor wire coils 104 allowing discharge of energy from the magnetic field to the load device. The energy storage device 100 provides a relatively lightweight, high energy-storage capacity, and therefore a high specific energy. Also, the energy storage device 100 can be charged or discharged rapidly; thereby, providing high specific power. The energy storage device 100 may be useful for operation in circumstances that require high specific energy and high specific power, such as pulsed-power systems or directed energy weapons. Additionally, arranging the bulk superconductor rings 102 and the superconductor wire coils 104 such that they define a magnetic field containment region that forms a closed geometric shape results in relatively small magnetic field gradients. The energy storage device 100 can be supported and mechanically constrained using relatively simple structures, as shown in FIG. 4. Further, the bulk superconductor rings 102 resist penetration of the magnetic field by generating currents that create a magnetic guide, which limits leakage from the magnetic field confinement region. As a result, the energy storage device 100 can be used with little or no external magnetic shielding.

Figure 2:
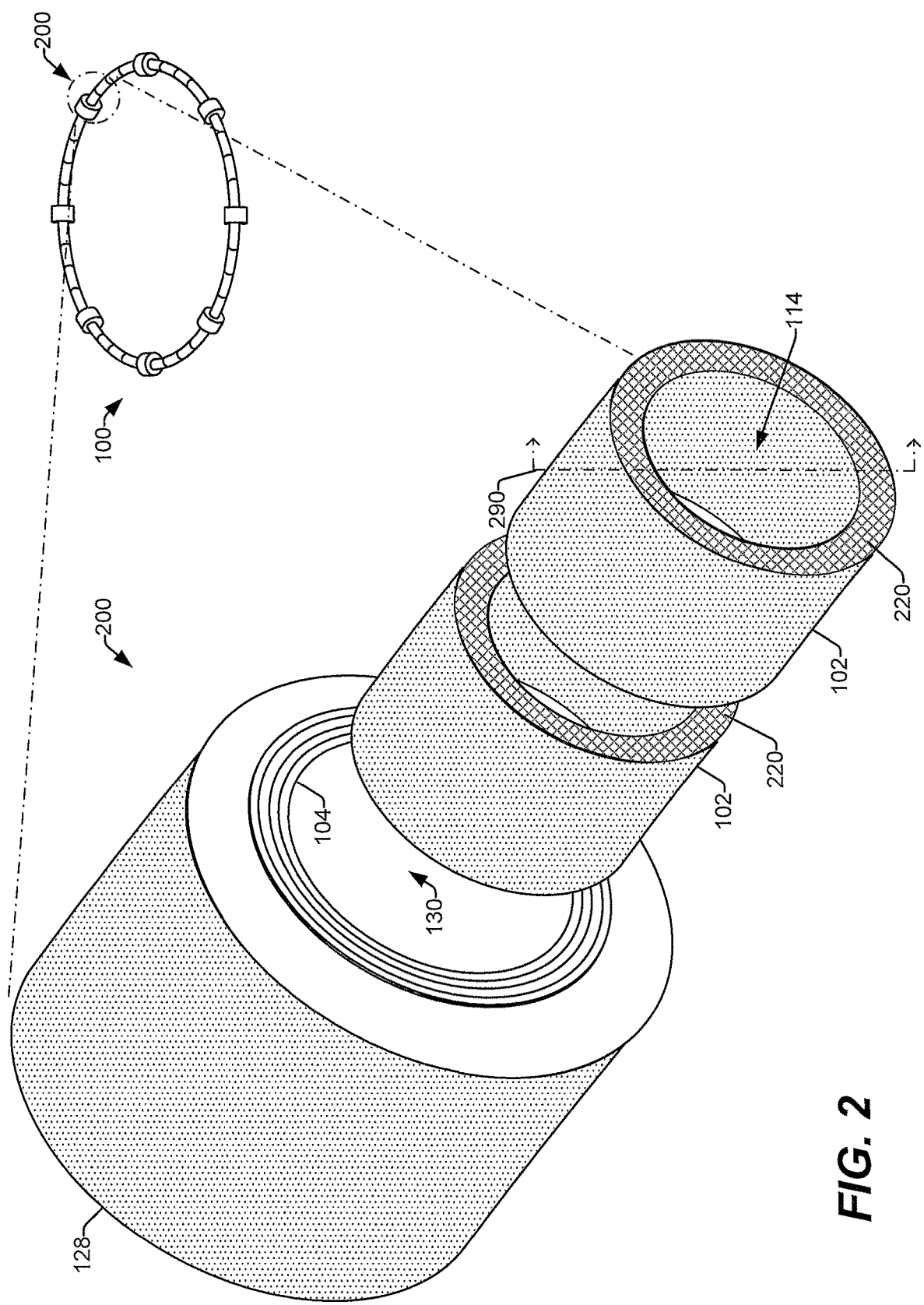
FIG. 2 is a diagram illustrating a portion of the energy storage device of FIG. 1 in more detail.

FIG. 2 illustrates a portion 200 of the energy storage device 100 in greater detail. In particular, the portion 200 of the energy storage device 100 is illustrated in a perspective view and shows a particular one of the superconductor wire coils 104 separated from adjacent bulk superconductor rings 102. FIG. 2 also illustrates an insulating layer 220 on a surface of each of the bulk superconductor rings 102. The insulating layer 220 is configured to electrically isolate one bulk superconductor ring from an adjacent bulk superconductor ring. For example, in FIG. 2, the insulating layer 220 is on a surface of each bulk superconductor ring 102 that is adjacent to another of the bulk superconductor rings 102. In other examples, the insulating layer 220 may also be present on other surfaces of the bulk superconductor rings 102. The insulating layer 220 may include or correspond to a coating (e.g., a polymer) or a deposited layer of non-conductive material.

In FIG. 2, the superconductor wire coil 104 is surrounded by or shielded by a ring 128. As described with reference to FIG. 1, the ring 128 may include the superconductive material 132. In the arrangement illustrated in FIG. 2, the central openings 114 of the bulk superconductor rings 102 are aligned with the central opening 130 of the superconductor wire coil 104 to define the magnetic field confinement region. FIG. 2 also illustrates a cross-section line 290, which corresponds to views illustrated in FIGS. 3A-3D.

FIGS. 3A-3D illustrate various arrangements of bulk superconductor rings 102 and a particular one of the superconductor wire coils 104 to form a closed geometric shape. Each of FIGS. 3A-3D illustrates a set of the bulk superconductor rings 102 adjacent to the particular one of the superconductor wire coils 104 in a cross-sectional view along the cross-section line 290 of FIG. 2. For example, in each of FIGS. 3A-3D, an upper portion of each of the bulk superconductor rings 102 is shown on a first side 250 of the magnetic field confinement region 230, and a lower portion of each of the bulk superconductor rings 102 is shown on a second side 260 of the magnetic field confinement region 230. Likewise, an upper portion of the particular one of the superconductor wire coils 104 is shown on the first side 250 of the magnetic field confinement region 230, and a lower portion of the particular one of the superconductor wire coil 104 is shown on the second side 260 of the magnetic field confinement region 230.

Figure 3A:
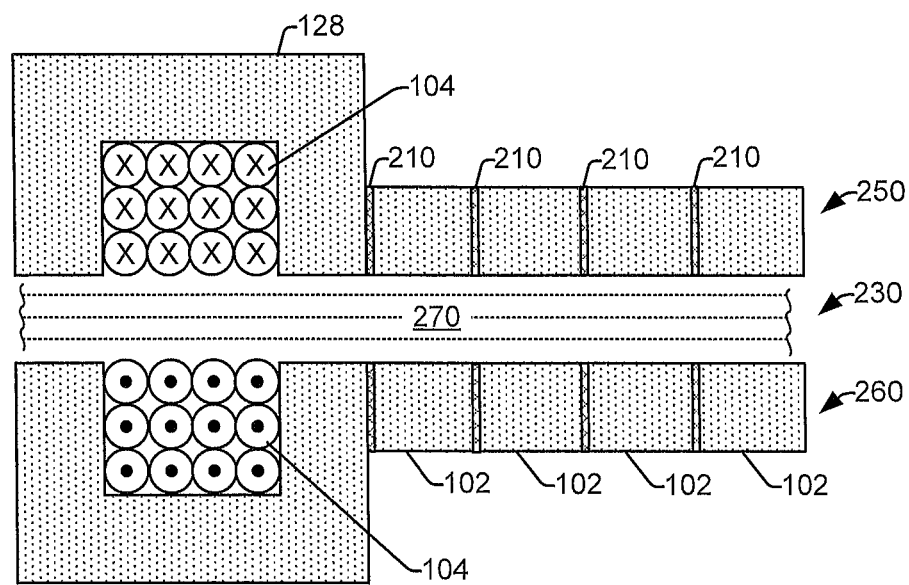
FIGS. 3A, 3B, 3C and 3D are diagrams illustrating a portion of the energy storage device of FIG. 1 in more detail, according to particular implementations.

In FIG. 3A, the bulk superconductor rings 102 are physically spaced apart from one another by spacers 210. For example, at least one of the spacers 210 is positioned between each pair of the bulk superconductor rings 202. In some implementations, the spacers 210 also electrically isolate (e.g., insulate) the bulk superconductor rings 102 from each other. In such implementations, the insulating layers 220 can be omitted from the bulk superconductor rings 102. Further in the example illustrated in FIG. 3A, one of the spacers 210 is located between the ring 128 of the particular one of the superconductor wire coils 104 and an adjacent one of the bulk superconductor rings 102. In other implementations, the superconductor wire coils 104 are not shielded by the rings 128. In these implementations, one of the spacers 210 is positioned between the adjacent bulk superconductor ring 102 and the superconductor wire coil 104.

In the particular example illustrated in FIG. 3A, the spacers 210 and bulk superconductor rings 102 are shaped to form a relatively straight magnetic field confinement region 230. Accordingly, the cross-sectional view illustrated in FIG. 3A may correspond to a portion of an energy storage device 100 that forms a closed geometric shape that includes straight portions, such as one of the closed geometric shapes shown in FIGS. 5A-5C.

Figure 3B:
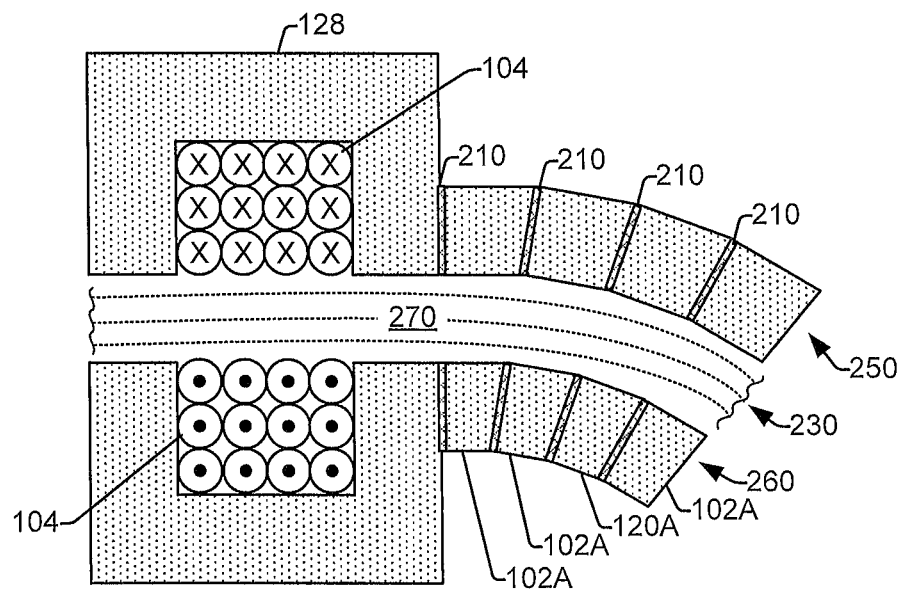

FIG. 3B illustrates a cross-sectional view of another arrangement of the bulk superconductor rings 102A and the spacers 210 with the particular one of the superconductor wire coils 104. The bulk superconductor rings 102A in FIG. 3B have a wedge shaped cross-section along the cross-section line 290 of FIG. 2. For example, each of the bulk superconductor rings 102A may have a shape similar to a circular cylinder with non-parallel ends. To illustrate, as shown in FIG. 3B, each of the bulk superconductor rings 102A is wider on the first side 250 of the magnetic field confinement region 230 than on the second side 260 of the magnetic field confinement region 230. The wedge-shaped bulk superconductor rings 102A of FIG. 3B enable forming a curved magnetic field confinement region 230. Accordingly, the arrangement illustrated in FIG. 3B may correspond to or be used for a portion of an energy storage device 100 defining a closed geometric shape with a curved portion. For example, the arrangement illustrated in FIG. 3B can be used to form the toroidal shape illustrated in FIG. 1 or another curved, closed magnetic shape, as described with reference to FIG. 5D.

Figure 3C:
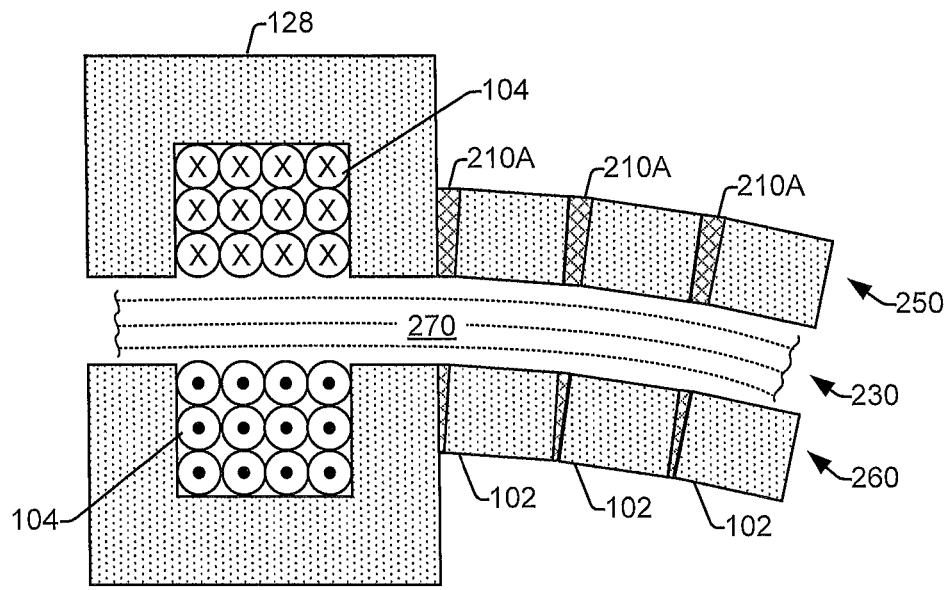

FIG. 3C illustrates another cross-sectional view of an arrangement of the bulk superconductor rings 102, the spacers 210A, and the particular one of the superconductor wire coils 104. In FIG. 3C, the spacers 210A are wedged shape. For example, each of the spacers 210 may have a shape similar to a circular cylinder with non-parallel ends. To illustrate, as shown in FIG. 3C, each of the spacers 210A is wider on the first side 250 of the magnetic field confinement region 230 than on the second side 260 of the magnetic field confinement region 230. In this example, the wedge-shaped spacers 210A enable forming a curved magnetic field confinement region 230.

Although not specifically illustrated, in some implementations, a combination of wedge-shaped bulk superconductor rings and wedge-shaped spacers can be used. For example, the wedge-shaped bulk superconductor rings 102A of FIG. 3B can be used with the wedge-shaped spacers 210A of FIG. 3C to form a particular closed geometric shape. Additionally, in some implementations, a closed geometric shape may be formed by using any combination of wedge-shaped bulk superconductor rings 102A, non-wedge-shaped bulk superconductor rings 102 (e.g., rings shaped like a right circular cylinder), wedge-shaped spacers 210A, and non-wedge-shaped spacers 210 (e.g., spacers shaped like a right circular cylinder). Further, while FIGS. 1-5D illustrate the energy storage device 100 arranged such that the closed geometric shape is substantially within a single plane, in other implementations, the closed geometric shape can be three-dimensional, such that a portion of the closed geometric shape is non-coplanar with another portion of the closed geometric shape.

Figure 3D:
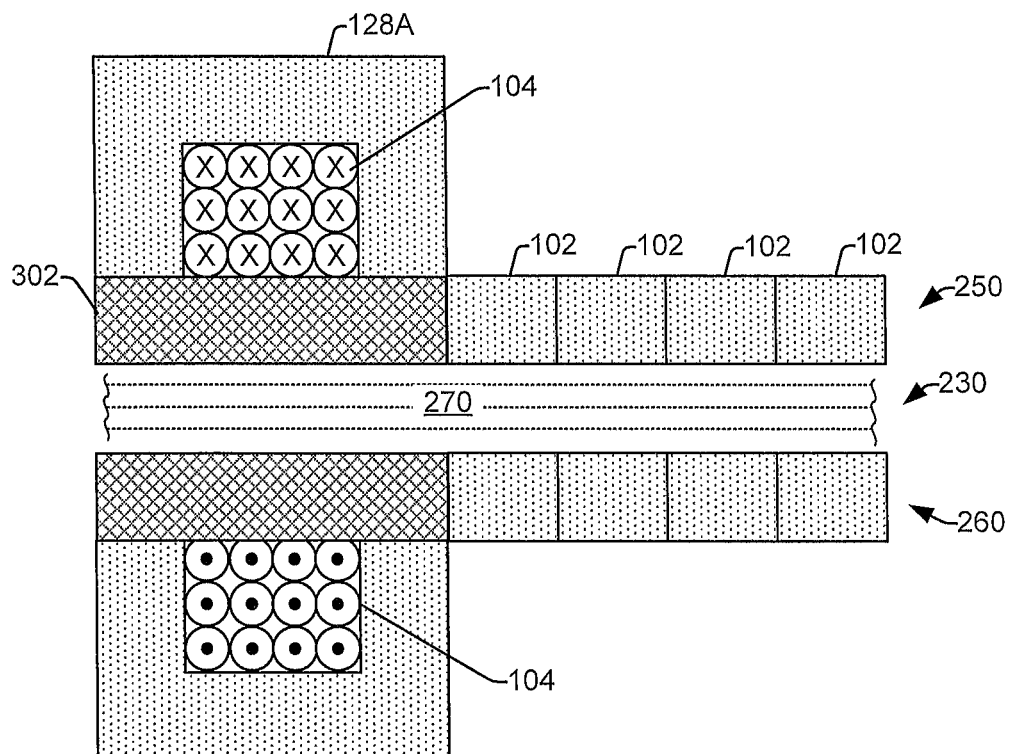

FIG. 3D illustrates another cross-sectional view of the bulk superconductor rings 102 and the particular one of the superconductor wire coils 104. In the implementation illustrated in FIG. 3D, the superconductor wire coil 104 is separated from the magnetic field confinement region 230 by a structure 302. The structure 302 may be ring-shaped (e.g., cylindrical). In a particular implementation, the structure 302 has an inner diameter approximately equal to an inner diameter of each of the bulk superconductor rings 102 and has an outer diameter approximately equal to the outer diameter of each of the bulk superconductor rings 102. In some implementations, the structure 302 is non-conductive (e.g., includes an insulator material or a dielectric material).

During manufacture of the energy storage device 100, the bulk superconductor rings 102 can be arranged to form the closed geometric shape, and the structure 302 can be positioned in the closed geometric shape (e.g., as though it were a bulk superconductor ring) as a placeholder for a superconductor wire coil 104. Further, the structure 302 may structurally support superconductor wire while wrapping the superconductor wire to form the superconductor wire coil 104. Alternatively, in some implementations, the superconductor wire may be wrapped to form the superconductor wire coil 104 on the structure 302 before the structure 302 is assembled with the bulk superconductor rings 102 to form the closed geometric shape.

The arrangement shown in FIG. 3D can be used with any of the arrangements illustrated in FIGS. 3A-3C. For example, the bulk superconductor rings 102 of FIG. 3D may be separated by spacers 210, as illustrated in FIG. 3A, or may be separated by wedge-shaped spacers 210A, as illustrated in FIG. 3C. As another example, the bulk superconductor rings 102 of FIG. 3D may be wedge shaped bulk superconductor rings 102A, as illustrated in FIG. 3B. As yet another example, the arrangement shown in FIG. 3D can be used with a combination of the arrangements illustrated in FIGS. 3A-3C. For example, the structure 302 can be used with any combination of wedge-shaped bulk superconductor rings 102A, non-wedge-shaped bulk superconductor rings 102, wedge-shaped spacers 210A, and non-wedge-shaped spacers 210 to form a closed geometric shape.

FIG. 4 illustrates a system 400 that includes the energy storage device 100 (shown in dotted lines) as well as related components. For example, in FIG. 4, the energy storage device 100 is contained within one or more structural members 402. For example, the one or more structural members 402 (shown in light weight solid lines) may include or correspond to one or more polymer layers, one or more ceramic layers, or one or more composite layers (e.g., a fiberglass/resin composite) arranged to at least partially house or enclose the energy storage device 100. In some examples, the one or more structural members 402 may include removable panels. The one or more structural members 402 may provide structural support to retain the bulk superconductor rings 102 and the superconductor wire coils 104 of the energy storage device 100. Further, in some implementations, the one or more structural members 402 provide electrical and/or magnetic shielding to reduce or limit energy leakage to devices or personnel near the energy storage device 100.

The energy storage device 100 of FIG. 4 is also coupled to one or more support members 416. The support members 416 are configured to support the weight of the energy storage device 100 and to enable fastening the energy storage device 100 to a body or surface, such as an airframe of an aircraft or a surface of a satellite.

FIG. 4 also shows the energy storage device 100 surrounded by one or more cooling elements 404 (shown in heavy solid lines), which are coupled to a cooling system 406. The cooling elements 404 allow circulation of a coolant around the energy storage device 100 to maintain the bulk superconductor rings 102 and superconductor wire coils 104 in a superconductive region associated with the superconductor materials. For example, the cooling system 406 may circulate liquid nitrogen (or another cryogenic liquid) within the cooling elements 404. The cooling elements 404 may also include or be surrounded by a thermal-insulating material (not shown) to reduce conductive, convective, and/or radiative heat transfer to the energy storage device 100 from the surrounding environment.

The system 400 also includes a switch 410 coupled via an electrical interconnect 408 to the energy storage device 100. The electrical interconnect 408 may correspond to or include the electrical interface 140 illustrated in FIG. 1. Alternatively, the electrical interconnect 408 may be coupled to electrical interfaces 140 of more than one of the superconductor wire coils 104 of the energy storage device 100. For example, in some implementations, the electrical interconnect 408 is coupled (in an electrical series configuration or in an electrical parallel configuration) to each of the superconductor wire coils 104 of the energy storage device 100. In another example, the system 400 may include multiple switches, including the switch 410 and other switches (not shown). In this example, each switch may be coupled to a different one of the superconductor wire coils 104 or to a different set of the superconductor wire coils 104 than each other switch.

The switch 410 is configured to selectively connect the energy storage device 100 to a load device 412 or to a power supply 414. Additionally, the switch 410 may be able to disconnect the energy storage device 100 from both the load device 412 and the power supply 414 such that the energy storage device 100 is in a storage mode. In a particular implementation, a first set of the superconductor wire coils 104 is used to charge the energy storage device 100, and a second (different) set of the superconductor wire coils 104 is used to discharge the energy storage device 100. In this implementation, a first switch may be coupled between the power supply 414 and the first set of the superconductor wire coils 104 to selectively couple the first set of the superconductor wire coils 104 to the power supply 414. Likewise, a second switch may be coupled between the load device 412 and the second set of the superconductor wire coils 104 to selectively couple the second set of the superconductor wire coils 104 to the load device 412. In this implementation, the energy storage device 100 can be concurrently charged and discharged.

Further, while only one power supply 414 and one load device 412 are illustrated in FIG. 4, in some implementations, the system 400 includes more than one power supply, more than one load device, or both. For example, the system 400 may include a first load device that is selectively connectable (via a first switch) to a first superconductor wire coil and may include a second load device that is selectively connectable (via a second switch) to a second superconductor wire coil. In this example, the first load device may have different power requirements than the second device. Accordingly, the first superconductor wire coil may be configured to provide power to the first load device according to a power requirement of the first load device, and the second superconductor wire coil may be configured to provide power to the second load device according to a power requirement of the second load device. To illustrate, the second load device may use a lower voltage than the first load device. Accordingly, the second superconductor wire coil may include fewer windings than the first superconductor wire coil.

In FIG. 4, the system 400 also includes a control system 420 (e.g., a controller or a line replaceable unit). The control system 420 may be configured to control (e.g., to send control commands or signals to) the cooling system 406, the switch 410, or both. The control system 420 may also be configured to control one or more other devices, such as the load device 412 or the power supply 414.

During operation, the control system 420 may cause the switch 410 to electrically connect one or more of the superconductor wire coils 104 of the energy storage device 100 to the power supply 414. The power supply 414 may cause a current (e.g., charging current ($I_{CHARGING}$) 422) to flow through the connected superconductor wire coils 104, and the current may generate or augment the magnetic field 270 in the magnetic field confinement region 230. Thus, energy from the power supply 414 is stored within the magnetic field 270 contained within the closed geometric shape of the energy storage device 100.

After energy has been stored in the energy storage device 100, the control system 420 may cause the switch 410 to connect one or more superconductor wire coils 104 of the energy storage device 100 to the load device 412. The magnetic field 270 in the magnetic field confinement region 230 of the energy storage device 100 induces a current (e.g., discharge current ($I_{DISCHARGE}$) 424) in the connected superconductor wire coils 104, and the current may be supplied to the load device 412. Thus, by simply switching which device the superconductor wire coils 104 are electrically connected to, the energy storage device 100 can be charged or discharged.

Figure 5A:
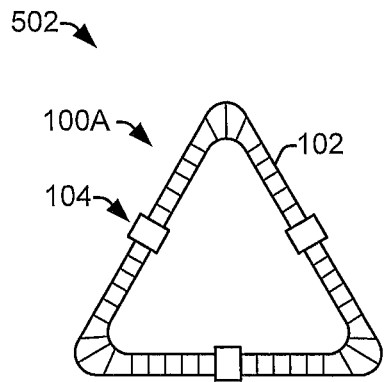
FIGS. 5A, 5B, 5C, and 5D are diagrams illustrating various configurations of the energy storage device of FIG. 1.
Figure 5B:
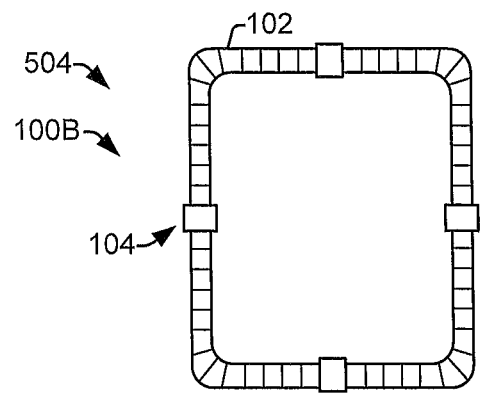
Figure 5C:
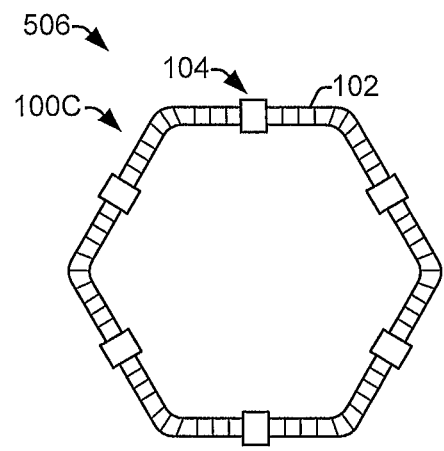
Figure 5D:
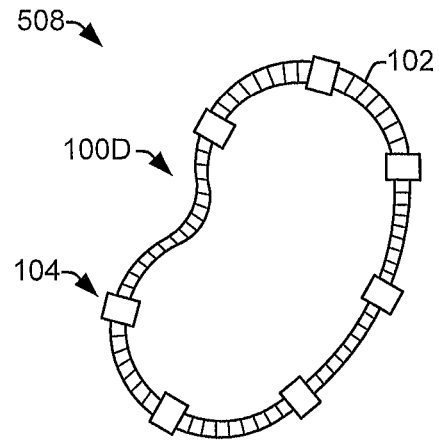

FIGS. 5A-5D illustrate other arrangements of closed geometric shapes that may be formed by the energy storage device 100 of FIG. 1. For example, in FIG. 5A, the energy storage device 100A is arranged to form a triangular closed geometric shape 502. In FIG. 5B, the energy storage device 100B is arranged to form a rectangular closed geometric shape 504. Further, in FIG. 5C, the energy storage device 100C is arranged to form a hexagonal closed geometric shape 506. In FIG. 5D, the energy storage device 100D is arranged to form an irregular closed geometric shape 508 (e.g., a racetrack-like shape or a kidney-like shape).

The examples illustrated in FIGS. 5A-5D are not limiting. Rather, the energy storage device 100 can be arranged in any regular or irregular closed geometric shape. Further, the superconductor wire coils 104 illustrated in FIGS. 5A-5D may be positioned in other locations than illustrated. For example, in FIG. 5A, the triangular closed geometric shape 502 may include more than three superconductor wire coils 104 or fewer than three superconductor wire coils 104, and the superconductor wire coils 104 may be positioned at locations other than a center of each face of the triangular closed geometric shape 502. Additionally, while the examples illustrated in FIGS. 5A-5D show two-dimensional closed geometric shapes, in other examples, the energy storage device 100 can be arranged to form a closed three-dimensional shape in which a portion of the closed geometric shape is non-coplanar with another portion of the closed geometric shape. Stated another way, a centerline of the magnetic field confinement region 230 of the energy storage device 100 may not lie on a single plane.

Figure 6:
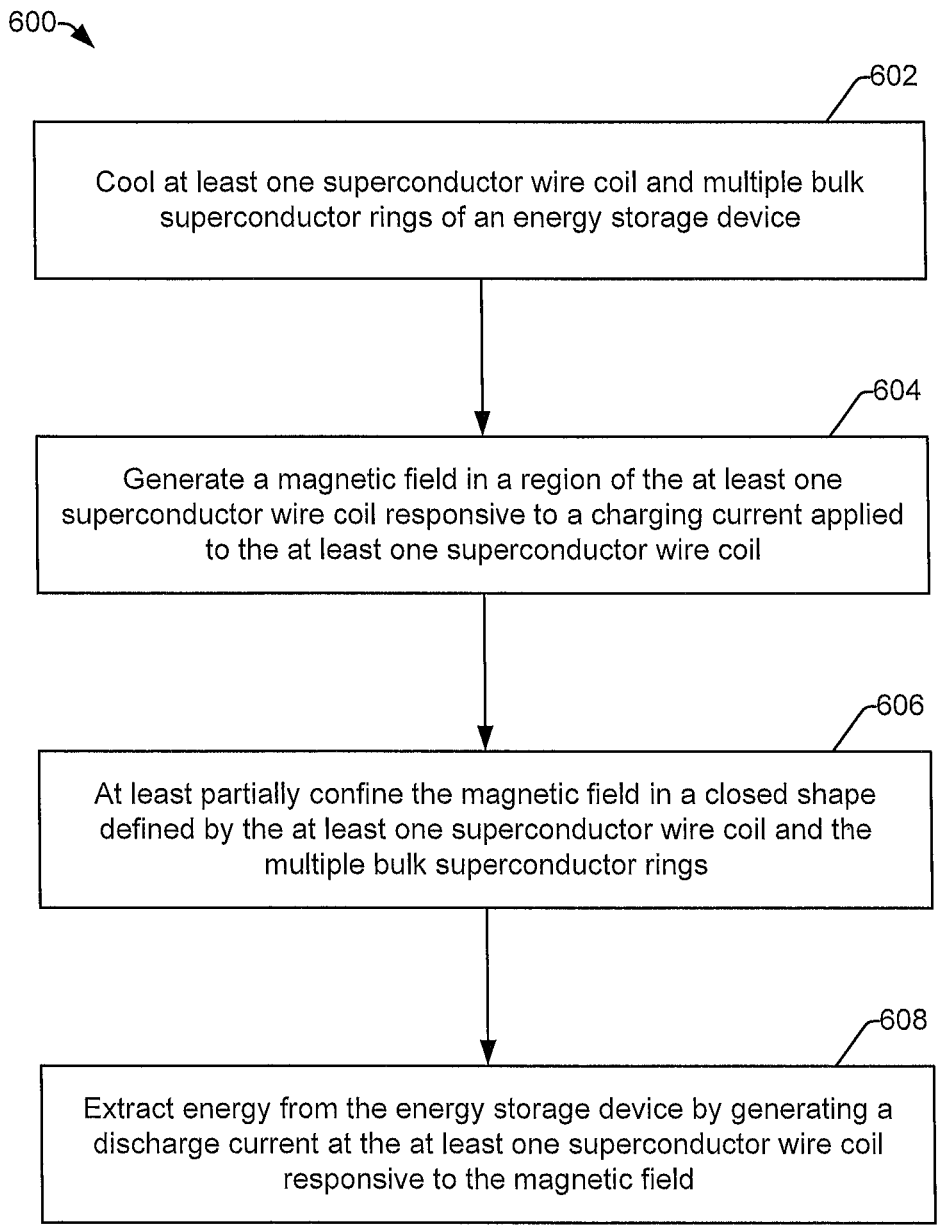
FIG. 6 is a flowchart illustrating a particular embodiment of a method of operation of the energy storage device of FIG. 1.

FIG. 6 is a flowchart illustrating a particular embodiment of a method 600 of operation of the energy storage device 100 of FIGS. 1-5D. The method 600 includes, at 602, cooling at least one superconductor wire coil and multiple bulk superconductor rings of an energy storage device. For example, the cooling system 406 may cool the energy storage device 100 by circulating a cryogenic liquid within the cooling elements 404 of FIG. 4. The energy storage device 100 may be cooled to at least a superconductive transition temperature of the superconductive material 116 of the bulk superconductor rings 102.

The method 600 also includes, at 604, generating a magnetic field in a region of the at least one superconductor wire coil responsive to a charging current applied to the at least one superconductor wire coil. For example, after the energy storage device 100 is cooled to (or cooled below) the superconductor transition temperature, the control system 420 may cause the switch 410 to be actuated to connect at least one of the superconductor wire coils 104 to the power supply 414. In this example, the power supply 414 supplies a current (e.g., the $I_{CHARGING}$ 422) to the at least one of the superconductor wire coils 104, and the at least one of the superconductor wire coils 104 generates the magnetic field 270 responsive to the current.

The method 600 further includes, at 606, at least partially confining the magnetic field in a closed shape defined by the at least one superconductor wire coil and the multiple bulk superconductor rings. For example, the magnetic field 270 generated by the at least one of the superconductor wire coils 104 may interact with adjacent bulk superconductor rings 102 to form a closed magnetic loop in the magnetic field confinement region 230 of the energy storage device 100.

The method 600 also includes, at 608, after generating the magnetic field, extracting energy from an energy storage device by generating a discharge current at the at least one superconductor wire coil responsive to the magnetic field. For example, after energy is stored in the magnetic field 270 of the energy storage device 100, the control system 420 may cause the switch 410 to be actuated to connect the at least one of the superconductor wire coils 104 to the load device 412. In this example, the magnetic field 270 induces a current (e.g., the $I_{DISCHARGE}$ 424) in the at least one of the superconductor wire coils 104, and the at least one of the superconductor wire coils 104 supplies the current to the load device 412.

Figure 7:
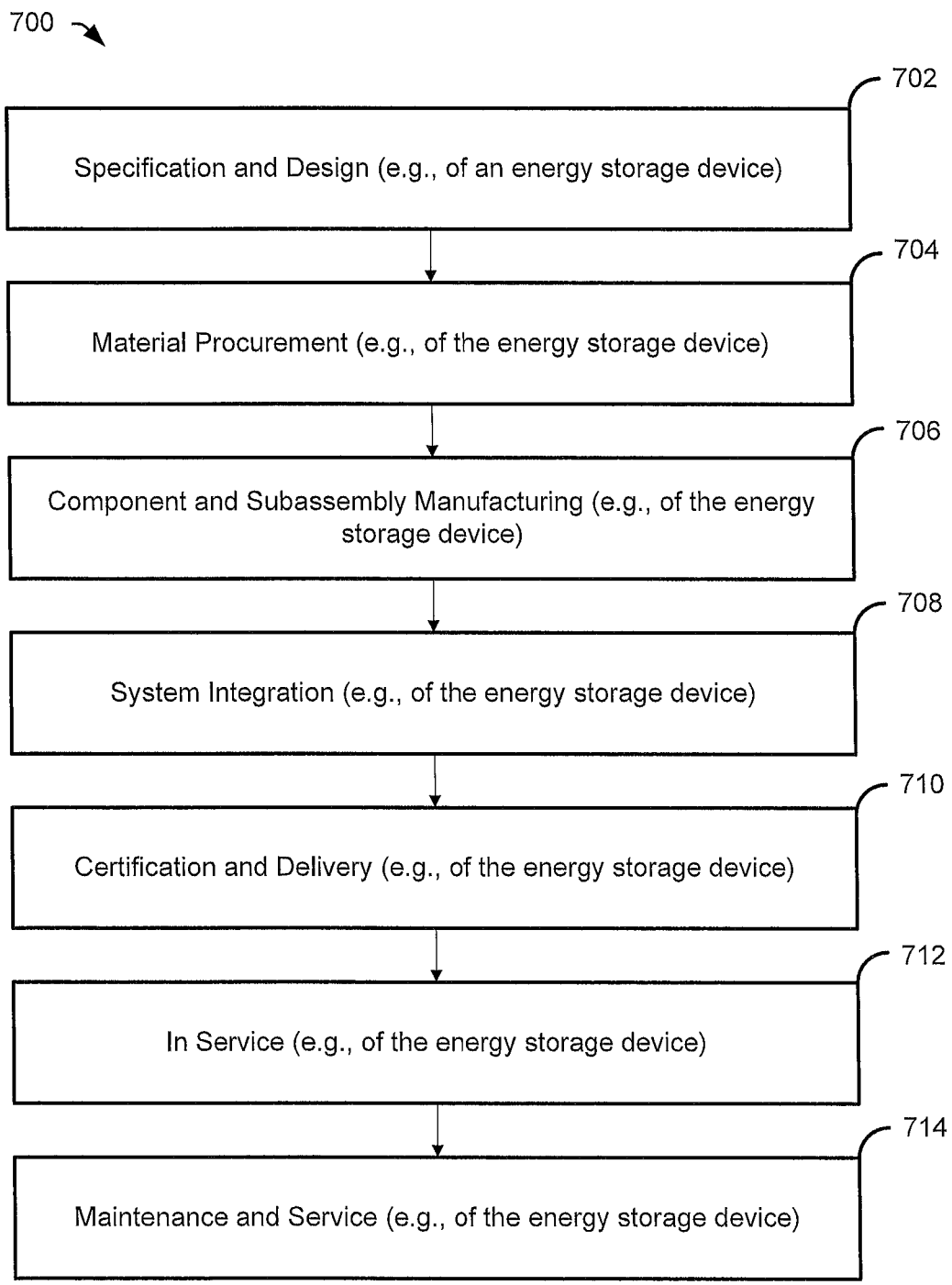
FIG. 7 is a flow diagram of aircraft production and service methodology.
Figure 8:
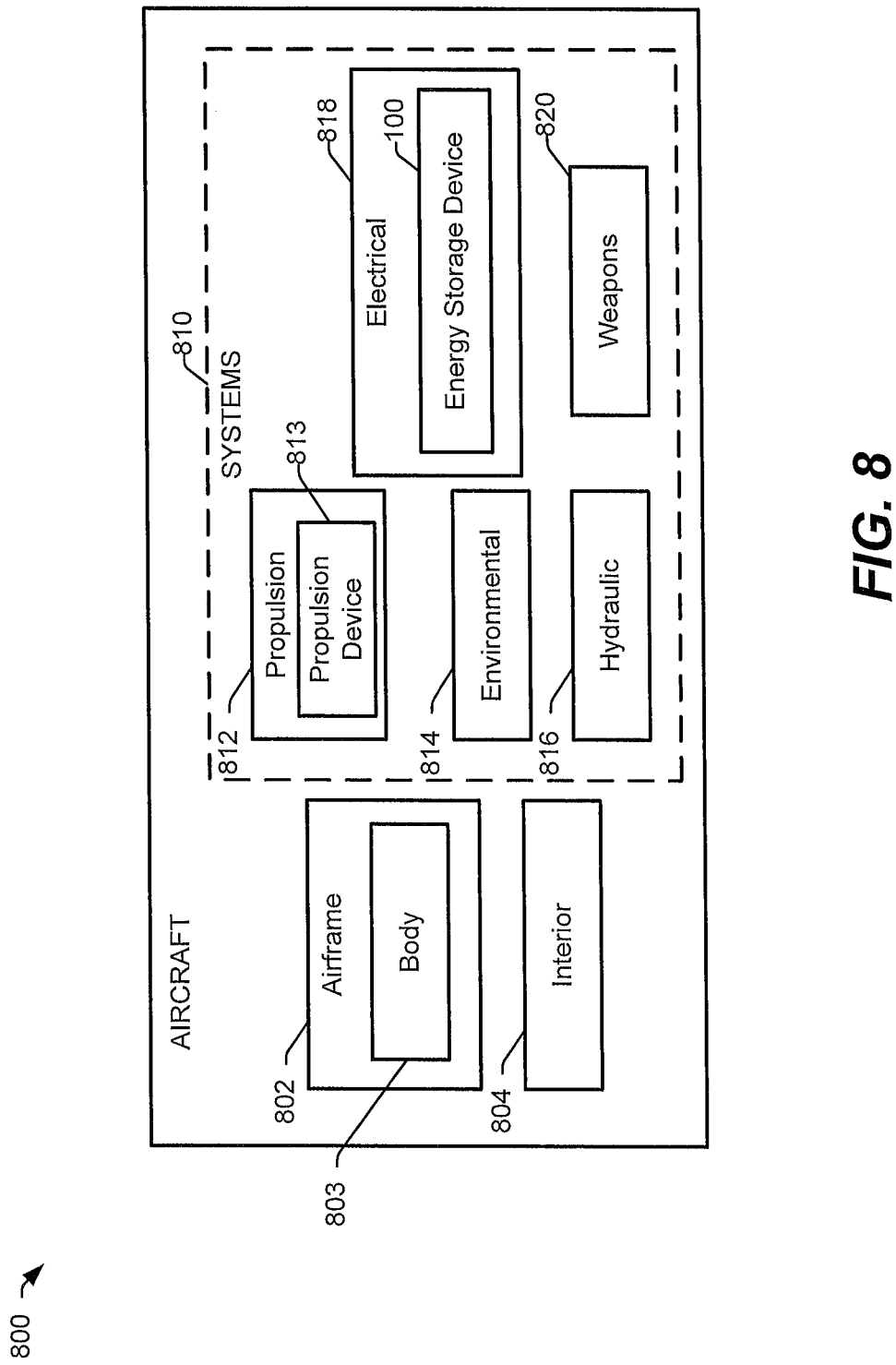
FIG. 8 is a block diagram of an aircraft including the energy storage device of FIG. 1.

Embodiments of the disclosure may be described in the context of an aircraft manufacturing and service method 700 as shown in FIG. 7 and an aircraft 800 as shown in FIG. 8. For example, the aircraft 800 may include an electrical system 818 that includes the energy storage device 100. During pre-production, the method 700 may include specification and design 702 of the aircraft 800 and material procurement 704. During production, component and subassembly manufacturing 706 and system integration 708 of the aircraft 800 takes place. Thereafter, the aircraft 800 may go through certification and delivery 710 in order to be placed in service 712. While in service by a customer, the aircraft 800 is scheduled for routine maintenance and service 714 (which may also include modification, reconfiguration, refurbishment, and so on).

Each of the processes of method 700 may be performed or carried out by a system integrator, a third party, and/or an operator (e.g., a customer). For the purposes of this description, a system integrator may include without limitation any number of aircraft manufacturers and major-system subcontractors; a third party may include without limitation any number of venders, subcontractors, and suppliers; and an operator may be an airline, leasing company, military entity, service organization, and so on.

As shown in FIG. 8, the aircraft 800 produced by exemplary method 700 may include an airframe 802 (including a body 803), a plurality of systems 810, and an interior 804. Examples of high-level systems 810 include one or more of a propulsion system 812, the electrical system 818, a hydraulic system 816, and an environmental system 814. Any number of other systems may be included. Although an aerospace example is shown, the present disclosure may be applied to other industries. For example, the energy storage device 100 may be used in a power generation or distribution facility, onboard a manned or unmanned vehicle (such as a spacecraft, a watercraft, or a land-based vehicle), or in a portable power system. In some implementations, the systems 810 include a weapon 820 of a weapons system. For example, the weapon 820 may include a pulsed-power weapon coupled to and powered via the energy storage device 100. In some implementations, the energy storage device 100 is coupled to and provides power to a propulsion device 813 of the propulsion system 812.

Apparatus and methods embodied herein may be employed during any one or more of the stages of the production and service method 700. For example, components or subassemblies corresponding to production process 706 may be fabricated or manufactured in a manner similar to components or subassemblies produced while the aircraft 800 is in service. Also, one or more apparatus embodiments, method embodiments, or a combination thereof may be utilized during the production stages 706 and 708, for example, by substantially expediting assembly of or reducing the cost of an aircraft 800. Similarly, one or more of apparatus embodiments, method embodiments, or a combination thereof may be utilized while the aircraft 800 is in service 712, for example and without limitation, or during maintenance and service 714.

Embodiments described above are illustrative and do not limit the disclosure. It is to be understood that numerous modifications and variations are possible in accordance with the principles of the present disclosure.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. An energy storage device comprising:
   multiple bulk superconductor rings;
   at least one superconductor wire coil between the multiple bulk superconductor rings, the multiple bulk superconductor rings and the at least one superconductor wire coil interconnected to define a closed geometric shape; and
   a spacer between two or more bulk superconductor rings of the multiple bulk superconductor rings, wherein the spacer electrically isolates a first bulk superconductor ring of the multiple bulk superconductor rings from a second bulk superconductor ring of the multiple bulk superconductor rings, and wherein the first bulk superconductor ring is configured to induce a magnetic field in the second bulk superconductor ring.

2. The energy storage device of claim 1, wherein the multiple bulk superconductor rings and the at least one superconductor wire coil are included in an aircraft or a spacecraft as an energy storage device.

3. The energy storage device of claim 1, further comprising a plurality of spacers between the multiple bulk superconductor rings.

4. The energy storage device of claim 3, wherein the second bulk superconductor ring is electrically isolated from a third bulk superconductor ring of the multiple bulk superconductor rings.

5. The energy storage device of claim 1, further comprising an insulating layer between two or more bulk superconductor rings of the multiple bulk superconductor rings.

6. The energy storage device of claim 1, wherein the closed geometric shape is a curved shape.

7. The energy storage device of claim 1, wherein the at least one superconductor wire coil comprises a plurality of superconductor wire coils spaced around the closed geometric shape.

8. The energy storage device of claim 1, further comprising an electrical interface configured to couple the at least one superconductor wire coil to at least one of a power supply or a load device.

9. The energy storage device of claim 1, further comprising a particular ring comprising a superconductor material, wherein a first superconductor wire coil of the at least one superconductor wire coil is housed in the particular ring.

10. The energy storage device of claim 1, wherein a first superconductor wire coil of the at least one superconductor wire coil is configured to induce a magnetic field in each of the multiple bulk superconductor rings.

11. The energy storage device of claim 1, wherein the multiple bulk superconductor rings are configured to be magnetically linked while a current runs through a first bulk superconductor ring of the multiple bulk superconductor rings.

12. A method of operating an energy storage device, the method comprising:
    generating a magnetic field in a region of at least one superconductor wire coil responsive to a charging current applied to the at least one superconductor wire coil;
    at least partially confining the magnetic field in a closed shape defined by the at least one superconductor wire coil and multiple bulk superconductor rings, wherein a first bulk superconductor ring of the multiple bulk superconductor rings is electrically isolated from a second bulk superconductor ring of the multiple bulk superconductor rings; and
    inducing a magnetic field in the second bulk superconductor ring by the first bulk superconductor.

13. The method of claim 12, further comprising, after generating the magnetic field, extracting energy from the energy storage device by generating a discharge current at the at least one superconductor wire coil responsive to the magnetic field.

14. A system comprising:
    a load device;
    at least one superconductor wire coil coupled to the load device; and
    multiple bulk superconductor rings, the at least one superconductor wire coil between the multiple bulk superconductor rings, wherein the multiple bulk superconductor rings and the at least one superconductor wire coil are arranged to define a continuous magnetic confinement region of an energy storage device, wherein the multiple bulk superconductor rings are configured to be magnetically linked while a current runs through a first bulk superconductor ring of the multiple bulk superconductor ring.

15. The system of claim 14, wherein the load device includes a propulsion device.

16. The system of claim 14, further comprising one or more support members coupling the energy storage device to a body of a vehicle.

17. The system of claim 14, wherein the multiple bulk superconductor rings are electrically isolated from one another.

18. The system of claim 14, further comprising an insulating layer between two or more bulk superconductor rings of the multiple bulk superconductor rings.

19. The system of claim 14, further comprising a spacer between two or more bulk superconductor rings of the multiple bulk superconductor rings.

20. The system of claim 19, wherein the spacer electrically isolates a first bulk superconductor ring of the two or more bulk superconductor rings from a second bulk superconductor ring of the two or more bulk superconductor rings, and wherein the first bulk superconductor ring is configured to induce a magnetic field in the second bulk superconductor ring.

* * * * *